(12) United States Patent
Ivansen

(10) Patent No.: US 7,278,129 B2
(45) Date of Patent: Oct. 2, 2007

(54) HEALING ALGORITHM

(75) Inventor: Lars Ivansen, Solna (SE)

(73) Assignee: Micronic Laser Systems AB, Taby (SE)

( * ) Notice: Subject to any disclaimer, the term of this patent is extended or adjusted under 35 U.S.C. 154(b) by 245 days.

(21) Appl. No.: 10/937,737

(22) Filed: Sep. 9, 2004

(65) Prior Publication Data

US 2006/0053406 A1    Mar. 9, 2006

(51) Int. Cl.
*G06F 17/50*    (2006.01)
(52) U.S. Cl. .......................................... 716/20; 716/19
(58) Field of Classification Search ............. 716/19–20
See application file for complete search history.

(56) References Cited

U.S. PATENT DOCUMENTS 4,933,889 A  *  6/1990  Meshkat et al. ............... 716/20
5,812,412 A  *  9/1998  Moriizumi et al. ............ 716/21
6,813,757 B2 * 11/2004  Aton et al. ..................... 716/19
7,010,776 B2 *  3/2006  Gallatin et al. ................ 716/19

* cited by examiner

*Primary Examiner*—Jack Chiang
*Assistant Examiner*—Brandon W. Bowers
(74) *Attorney, Agent, or Firm*—Ernest J. Beffel, Jr.; Haynes Beffel & Wolfeld LLP

(57) ABSTRACT

An aspect of the present invention includes a method for reshaping sub-objects in at least one object in pattern design data to be presented to a mask writer or a direct writer for producing a pattern onto a workpiece, where said object comprises a plurality of slivers in a first direction, comprising the actions of: a) generating a list of slivers, repeating the actions of: b) comparing a dynamic object in an object list with the slivers in said list of slivers to look for adjacent slivers, c) removing adjacent slivers from said list of slivers to said object list, d) merging adjacent slivers with said dynamic object, e) terminating the repetition when no slivers in said list of slivers are adjacent to said dynamic object in said object list. Other aspects of the present invention are reflected in the detailed description, figures and claims.

13 Claims, 6 Drawing Sheets

HEALING ALGORITHM

TECHNICAL FIELD

The present invention relates to an improved data processing method in lithography for reducing the overall writing time, in particular it relates to an improved method of healing geometry data for mask or maskless lithography.

BACKGROUND OF THE INVENTION

Over time, chips have become increasingly complex and dense, as processors, memory circuits and other semiconductors have gained greater capacity. Memory circuits, in particular, and all circuits with small features, in general, have become denser. Patterns for these circuits have become even more complex than the circuits, as optical proximity and laser proximity correction features have been added to the patterns. The equipment and writing strategies have become increasingly sophisticated, in response to requirements for smaller features on chips and tighter critical dimensions.

A considerable amount of design data to be presented to a pattern generator, for instance a mask writer or a direct writer (maskless writer) is heavily slivered. A great deal of object/feature in design data, for instance CIF™, OASIS™, Applicon™, DXF™, MEBES™ or GDS-II™), is divided into several sub objects/features: These sub objects/features are created because said object/features comprise numerous jogs defining optical proximity and laser proximity corrections. A sub object/feature with a certain aspect ratio is defined as a sliver. Slivers make the processing of design data more, for not saying extremely, compute intensive and for the time being there are no mask writers or maskless writers, which benefit from the appearance of said slivers, yet said slivers are generated. A certain feature with a plurality of slivers will in total have an unnecessary large circumference, as all slivers are treated as an object to be printed. Treating numerous slivers will increase the total writing time for a raster pattern generator, for instance Micronic Sigma7300 or Micronic Omega6600, which is a problem. For a Vector shape beam pattern generator, for instance JEOL JBX-3030MV, there is also a problem with slivers since too narrow slivers will create CD (critical dimension) variations. If the slivers become small enough they are impossible to write with VSB pattern generators.

As manufacturers strive to keep pace with the Moor's law, there is a continuing need for writers that can process large volumes of geometric figures, i.e., object features in design data, and produce precise patterns on work pieces. There is a need in the art to reduce the writing time while producing the needed precise pattern.

SUMMARY OF THE INVENTION

An aspect of the present invention includes a method for minimizing a circumference of at least one object in pattern data to be presented to a mask writer or a direct writer, where said object comprises a plurality of slivers in a first direction, comprising the actions of: a) generating a list of slivers, b) comparing a dynamic object in an object list with the slivers in said list of slivers to look for adjacent slivers, c) removing adjacent slivers from said list of slivers to said object list, d) merging adjacent slivers with said dynamic object, e) repeating action b-d until no slivers in said list of slivers is adjacent to said dynamic object in said object list.

Other aspects of the present invention are reflected in the detailed description, figures and claims.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 3:
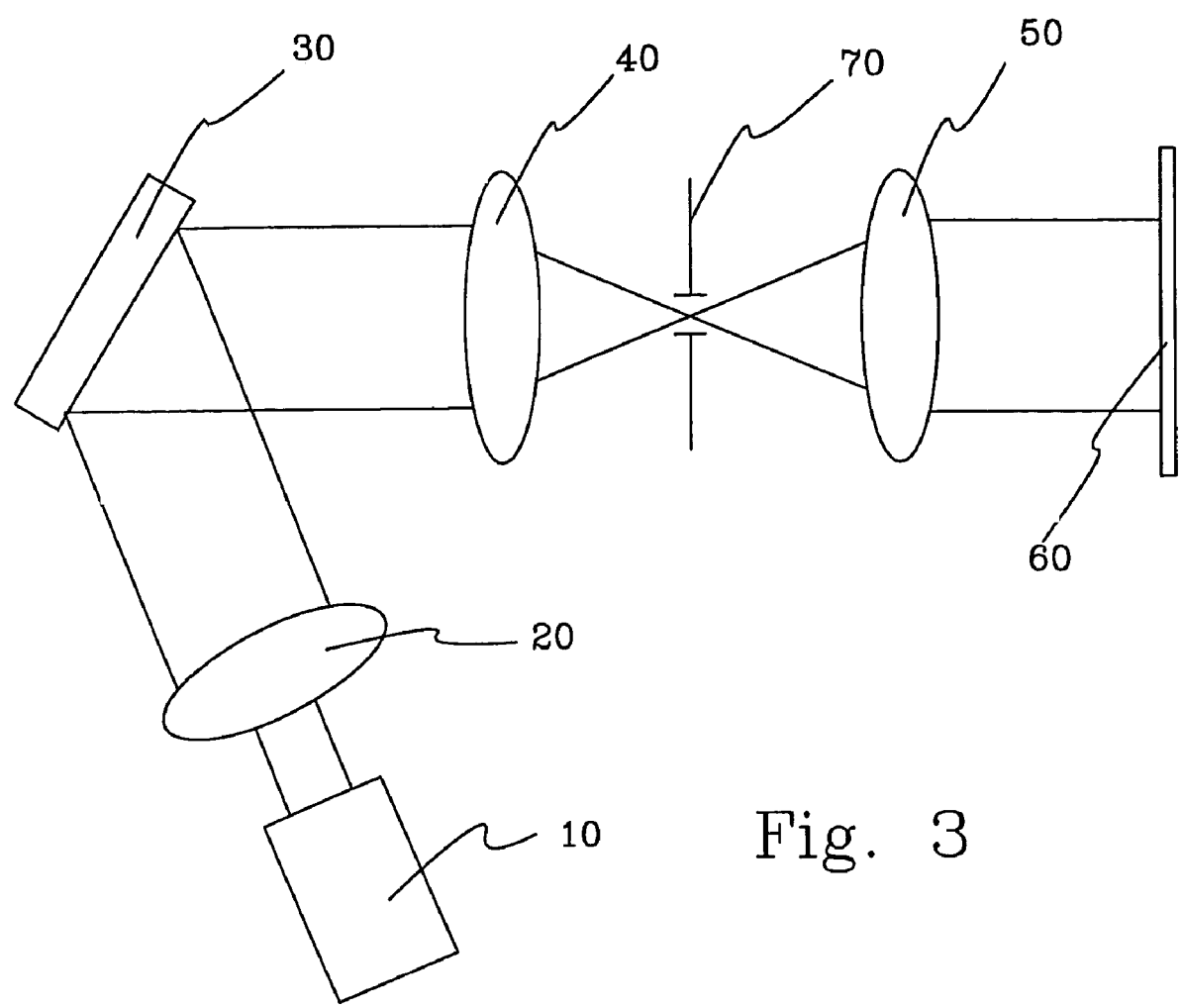
FIG. 3 depicts a simplified SLM mask- or mask-less writer.

FIG. 3 illustrates an embodiment of an apparatus for patterning a work piece 60 according to prior art, which may benefit of the present invention.

Said apparatus comprising a source 10 for emitting electromagnetic radiation, an objective lens arrangement 50, a computer-controlled reticle 30, a beam conditioning arrangement 20, a spatial filter 70 in a Fourier plane, a Fourier lens arrangement 40 and said work piece 60.

The source 10 may emit radiation in the range of wavelengths from infrared (IR), which is defined as 780 nm up to about 20 μm, to extreme ultraviolet (EUV), which in this application is defined as the range from 100 nm and down as far as the radiation is possible to be treated as electromagnetic radiation, i.e. reflected and focused by optical components. The source 10 emits radiation either pulsed or continuously. The emitted radiation from the continuous radiation source 10 can be formed into a pulsed radiation by means of a shutter located in the radiation path between said radiation source 10 and said computer-controlled reticle 30. For example, the radiation source may be a KrF excimer laser with a pulsed output at 248 nm, a pulse length of approximately 10 ns and a repetition rate of 1000 Hz. The repetition rate may be below or above 1000 Hz.

The beam conditioning arrangement 20 may be a simple lens or an assembly of lenses. The beam conditioning arrangement 20 distributes the radiation emitted from the radiation source 10 uniformly over a surface of the computer-controlled reticle 30. In case of a continuous radiation source a beam of such a source may be scanned over the surface of the computer-controlled reticle.

Workpiece 60 is moved in a systematic fashion so that the optical system synthesizes the desired device layer pattern.

The computer-controlled reticle 30 may be a Spatial Light Modulator (SLM). In this embodiment the SLM comprises all information at a single moment that is required to pattern a certain area of the workpiece 60.

For the remainder of this application an electrostatically controlled micro mirror matrix (one- or two dimensional) is assumed, although other arrangements as described above are possible, such as transmissive or reflective SLMs relying on LCD crystals or electrooptical materials as their modulation mechanism, or micromechanical SLMs using piezoelectric or electrostrictive actuation.

The SLM 30 is a programmable device that produces an output radiation beam that is modulated by separate inputs from a computer. The SLM 30 simulates the function of a mask through the generation of bright and dark pixels in response to computer fed data. For example the phase SLM 30 is an array of etched solid state mirrors. Each micromirror element is suspended above a silicon substrate by restoring hinges, which may be supported either by separate support posts or by the adjacent mirrors. Beneath the micromirror element are address electrodes. One micromirror represents one pixel in the object plane. The pixel in the image plane is here defined as to have the same geometry as the micromirror but the size may be different due to the optics, i.e. larger or smaller depending on whether the optics is magnifying or demagnifying.

The micromirror and the address electrodes act as a capacitor so that for example a negative voltage applied to the micromirror, along with a positive voltage to the address electrode, will twist the torsion hinges suspending the micromirror which in turn allow the micromirror to rotate or to move up or down, thereby creating a phase modulation of the reflected light.

A projection system comprises in this embodiment the Fourier lens arrangement 40, which may be a compounded tube lens, the spatial filter 70 and the objective lens arrangement 50. The Fourier lens arrangement 40 and the spatial filter 70 form together what is generally called a Fourier filter. The Fourier lens arrangement 40 projects the diffraction pattern onto the spatial filter 70. The objective lens arrangement 50, which may be a compounded final lens, forms the aerial image on the work piece 60.

The spatial filter 70 is in this embodiment an aperture in a plate. Said aperture being sized and positioned so as to block out essentially all light which is diffracted into the first and higher diffraction orders, for example said aperture may be located at the focal distance from the Fourier lens arrangement 40. The reflected radiation is collected by said Fourier lens arrangement 40 in the focal plane, which acts at the same time as a pupil plane of the objective lens arrangement 50. The aperture cuts out the light from the first and higher diffraction orders of the addressed micromirrors in the SLM, while the radiation from the non-addressed mirror surfaces can pass the aperture. The result is an intensity modulated aerial image on the work piece 60 as in conventional lithography.

Figure 4:
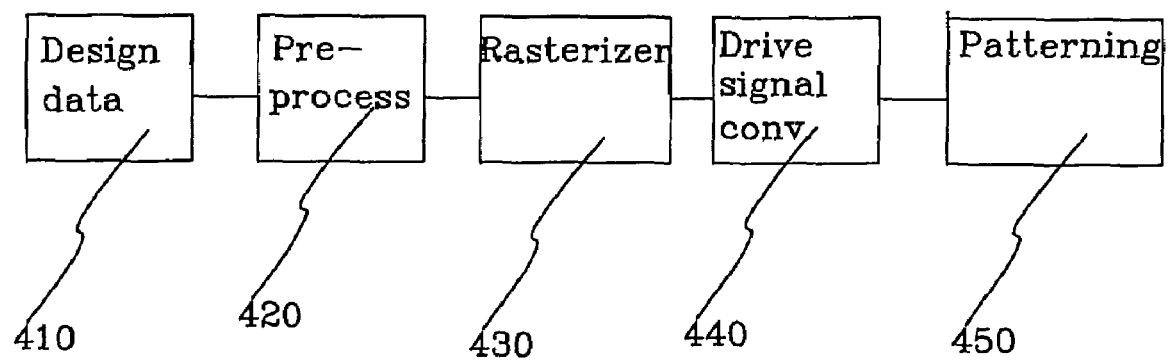
FIG. 4 depicts a schematic flowchart from design data to the patterning step in a lithographic raster pattern generator.

FIG. 4 depicts a schematic flowchart from design data to a patterning step in a lithographic pattern generator, i.e., a mask writer or a mask less writer. A first step indicates the pattern design raw data, which may come from CIF™, Applicon™, DXF™, MEBES™, OASIS™ or GDS-II™. Said design data needs to be preprocessed in the pre process step 420 in order to fit the pattern generator which is going to pattern said design data onto a workpiece, for instance a mask substrate or a semiconducting substrate. Said preprocess step may comprise the inventive method. In a rasterizer 430 said design data is rasterized into a pixel pattern. Said pixel pattern is preferably finer than the pixels of the pattern generator. In a SLM based pattern generator said pixels are micromirrors of a certain size, for instance a rectangle with a side being 16 μm. Such a size of a micromirror together with a demagnification of 200 times means a pixel size on said workpiece, which is 80 nm. Allowing each SLM pixel to be set in 65 different gray level states said pixel size on said workpiece decreases to 1.25 nm. The pixel size in said rasterized design data may be in the same order of magnitude or smaller as said pixel size of said SLM onto the workpiece. Said rasterized design data, now in pixel form, is thereafter transferred into drive signals for the micromirrors in said SLM.

Instead of using an SLM as a modulator for generating the pattern on said workpiece other types of lithographic methods may be used such as acousto optical modulator in combination with an acousto optical deflector, which is used in Mironic's pattern generator denoted Omega6600. Instead of using laser as the source for exposing a resist layer onto of said workpiece an electron beam source may be used according to well known techniques in the art and therefore needs no further clarification in this disclosure.

In a final patterning step 450 said SLM is loaded with the intended pattern and a laser pulse is impinged onto said SLM and relayed onto said workpiece where a layer sensitive to the wavelength used is exposed according to the pattern design data.

Figure 1A:
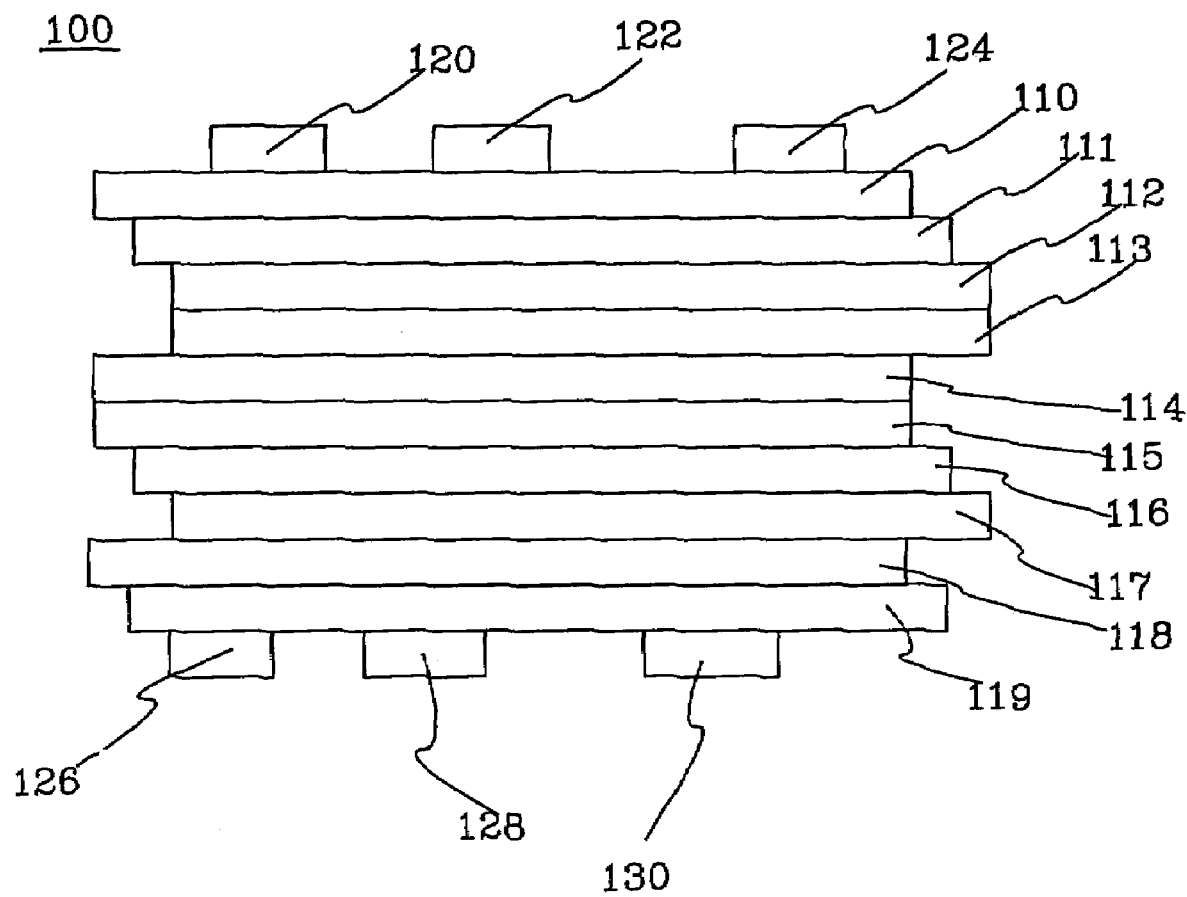
FIG. 1a depicts a design data feature as presented to a mask writer or a maskless writer.

FIG. 1*a* illustrates an object/feature 100 comprising numerous sub features/objects 110, 111, 112, 113, 114, 115, 116, 117 118, 119, 120, 122, 124, 126, 128, 130. The object/feature 100 illustrated in FIG. 1*a* is a typical example of how design data may look like as generated from a data format like CIF™, Applicon™, DXF™, MEBES™, OASIS™ or GDS-II™. The sub features/objects 110, 111, 112, 113, 114, 115, 116, 117 118, 119, 120, 122, 124, 126, 128, 130 are generated for each and every jog in y-direction. Some of said sub features/objects have an aspect ratio defining a sliver 110, 111, 112, 113, 114, 115, 116, 117, 118, 119. A sliver is a sub feature/object, which is much longer in a first direction, in FIG. 1*a* X-direction, compared to its perpendicular direction, in FIG. 1*a* Y-direction. The aspect ratio defining a sliver may vary, but a ratio of 1:10 may be a typical example of a sliver. When the aspect ratio is bigger than 1:3, i.e., 1:2 or 1:1 one is normally not talking about a sliver, whereas an aspect ratio equal or smaller than 1:3, i.e., 1:4, 1:5, 1:6 etc one is normally talking about a sliver.

In FIG. 1*a* sub objects 120, 112, 124, 126, 128, 130 are not treated as slivers as their aspect ratio is too large.

As can be seen from FIG. 1*a*, said object/feature 100 has a large feature outline or circumference when said slivers 110, 111, 112, 113, 114, 115, 116, 117, 118, 119 and other sub objects/features 120, 122, 124, 126, 128, 130 are taken into account, which is unnecessarily compute intensive for the pattern generator to handle. The reason why this slivered objects/features is so compute intensive is that each sliver is treated as an individual object, although many slivers belong to the same object to be printed, here in FIG. 1*a* said slivers 110, 112, 113, 114, 115, 116, 117, 118, 119 belong to feature 100.

Figure 1B:
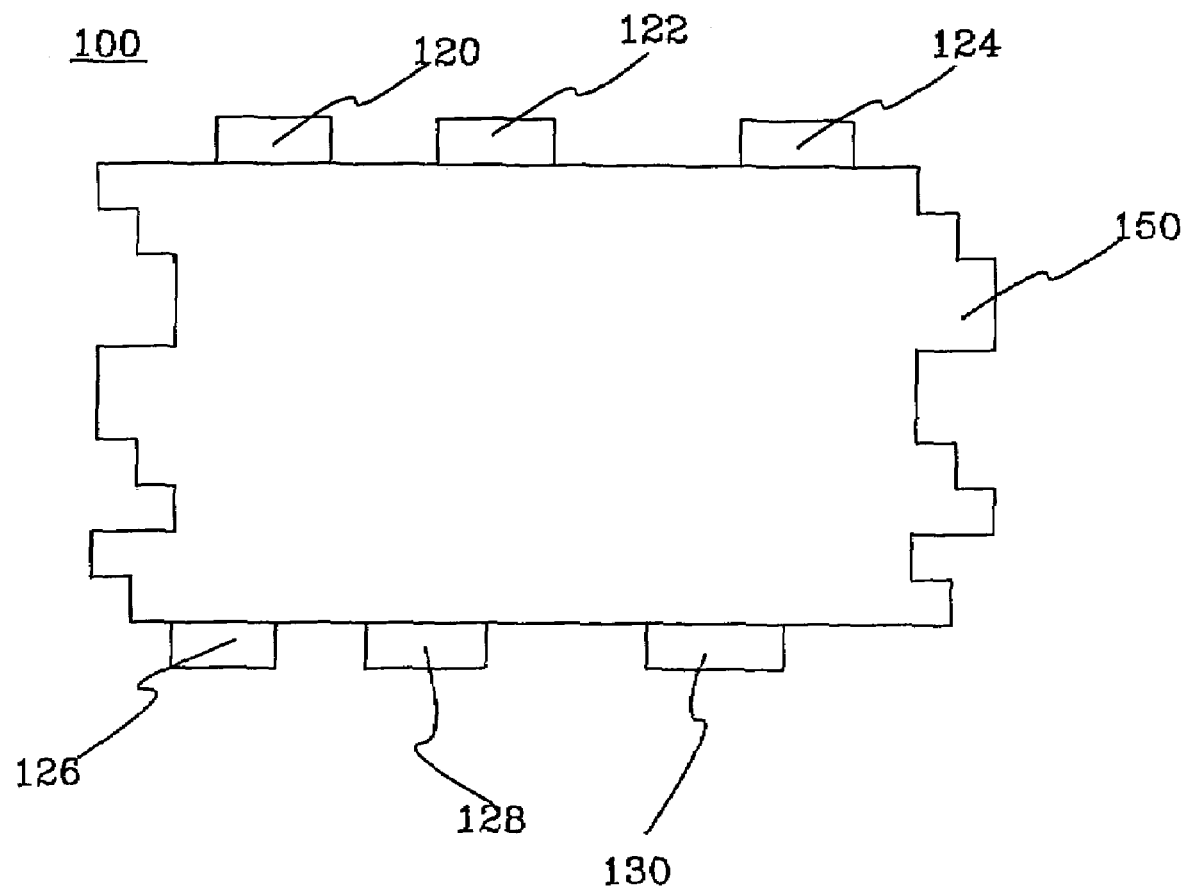
FIG. 1b depicts the feature in FIG. 1a after healing.

FIG. 1*b* illustrates the same object/feature 100 as illustrated in FIG. 1*a*, but here with all slivers healed according to an embodiment of the present invention. It is clear by just comparing FIGS. 1*a* and 1*b* with each other that the total feature outline or circumference is much smaller in FIG. 1*b* compared to FIG. 1*a*. It will take much less time to process sub object 150 together with sub objects 120, 122, 124, 126, 128 and 130 compared to sub objects 120, 122, 124, 126, 128, 130 and each and every sliver 110, 111, 112, 113, 114, 115, 116, 117, 118, 119.

Figure 1C:
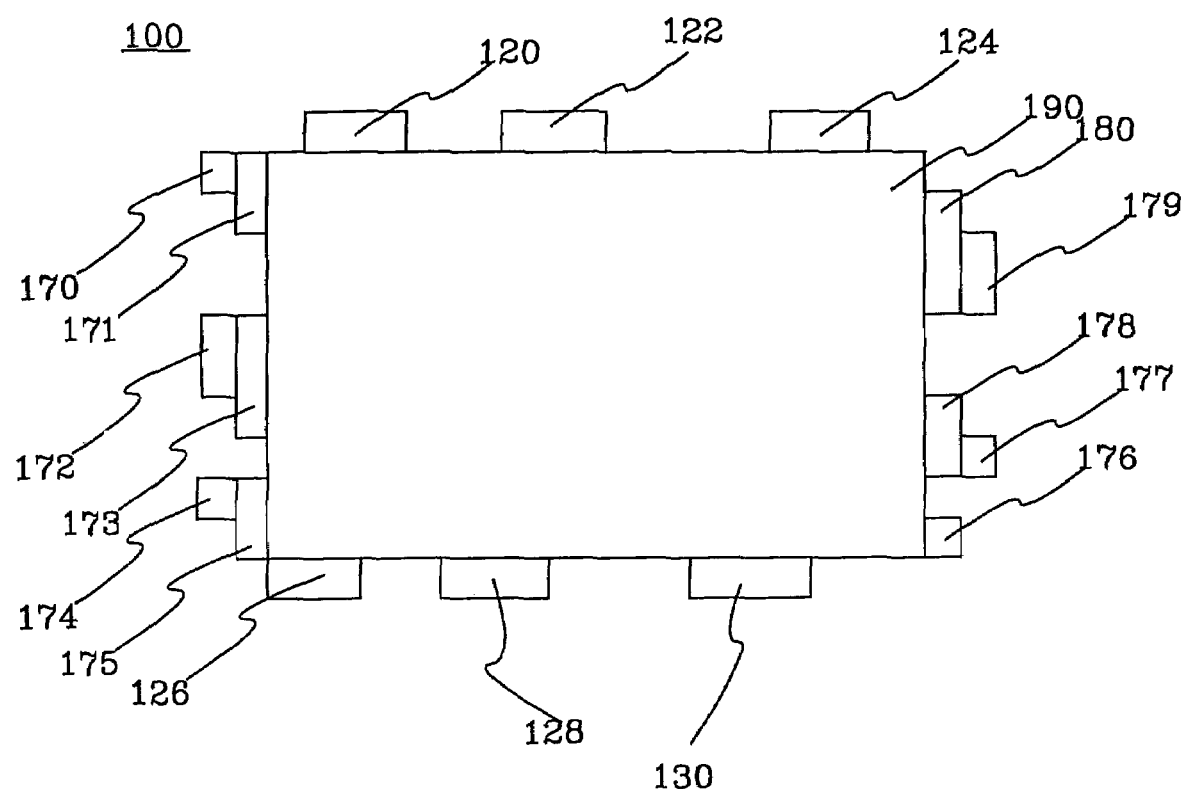
FIG. 1c depicts the feature as illustrated in FIG. 1b after refracturing.

FIG. 1*c* illustrates the same object/feature 100 as illustrated in FIG. 1*b*, but here after refracturing the sub object 150 in FIG. 1*b*. The original design data of feature/object 100 as illustrated in FIG. 1*a* had slivers extending in X-direction. For not recreating said slivers extending in X-direction said refracturing is performed in Y direction instead of X-direction, i.e., +/−90 degrees rotation of data.

By doing so the original slivers are not recreated. Instead new sub objects/features are created denoted by 170, 171, 172, 173, 174, 175, 176, 177, 178, 179, 180. Sub object 190 is a rectangle as is true for all other sub objects/features in FIG. 1c. Sub objects features 120, 122, 124, 126, 128, 130 are not changed during the healing process or the refracturing process.

Figure 2:
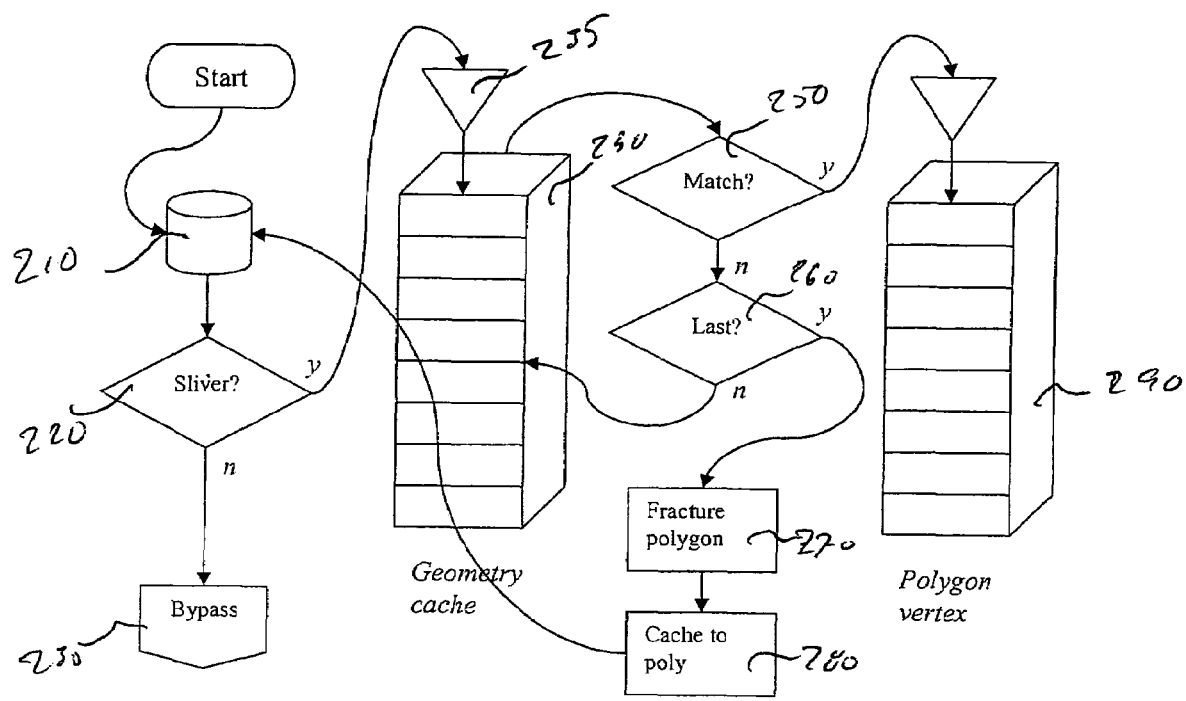
FIG. 2 depicts one embodiment of a healing method according to the present invention.

FIG. 2 illustrates a flow chart of one embodiment of the healing method according to the present invention. Objects/features are read from the design data storage 210. All objects/features are checked if said objects/features are slivers or not 220, which is determined by an aspect ratio to be defined, for instance smaller than 1:3. If said object/feature is not a sliver then bypass 230 said object/feature from the healing method and check a next object/feature from the design data storage 210. In FIG. 1a sub features/objects 120, 122, 124, 126, 128, 130 are bypassed from the healing method because of their aspect ratio.

If said object/feature is a sliver then store said sliver in a list of slivers 240. In one embodiment according to the present invention said list of slivers may contain all slivers in the design data storage 210. In another embodiment said list of slivers only comprises a limited number of the total amount of slivers in said design data storage 210. Healing of design data, in the most general form, is a compute intensive task where each and every one of the slivers is tested for absolute proximity towards all other slivers in a population of the design data. Such a test becomes quickly insurmountable with the vast object/feature count in semiconductor design.

By narrowing down the task to suppress the occurrences of slivers, one could rely on the assumption that slivers are generated in a pseudo systematic way, spatial proximity tends to have a correspondence in design data. A sliver typically has its neighbors located close in the design data storage. By leveraging this observation, a healing algorithm could be narrowed down to span only a window of object/feature candidates, and hence reduce the number of conditional test to a manageable level.

A list of slivers 240 holds slivers that are scanned for matching towards a current dynamic object in an object list 290. The size of the list of slivers is a tuning parameter, as could easily be understood from the description above, which has to be defined at a start up event. A larger list of slivers improves the probability of matching slivers into said dynamic object, but also increases the computer load. A smaller list may miss some of the matchmaking, but will execute more efficiently. The ideal balance must be determined by benchmarking production patterns.

The object list holds the dynamic object that is currently being generated. The size of the list is dynamic and grows with the number of slivers that are found to match. This could easily be understood since the more slivers that are joined or healed together into said dynamic object the more space is required to store said dynamic object, and the size of said space is depending on the number of successful matches. However, a maximum size of the list could be applied to keep it within manageable numbers.

In the embodiment where the number of slivers checked were less than the total number of slivers, there is a check when loading said list of slivers if said list is full or not 235. One of the slivers in said list of slivers is then transferred from said list to said list of objects 290, alternatively a completely new sliver from the design data storage 210 is transferred directly to the list of objects 290. Said sliver in said list of objects 290 is compared with the slivers in said list of slivers 240. Here one is comparing if one or a plurality of the slivers in said list of slivers is adjacent to the dynamic object in the list of objects 290. An upper long side of said dynamic object is compared to a lower long side of said slivers 110, 111, 112, 113, 114, 115, 116, 117, 118, 119 and a lower long side of said dynamic object is compared to an upper long side of said slivers 110, 111, 112, 113, 114, 115, 116, 117, 118, 119. Said upper or lower long side of said dynamic object is dynamically changing after merging with one or a plurality of said slivers.

The match making of slivers that are adjacent could be accelerated by limiting the test to exact matches of coordinates and along one axis only (the long side of the sliver). If said sliver for some reason are adjacent on the narrow side, those cases could be considered unusual and disregarded. An initial test only uses the Y-coordinate, looking for an exact match. If they match, the X intervals of the two slivers are checked for coincidence. By limiting the initial matchmaking to one axis dramatically reduces the number of tests and simplifies the structure in which the dynamic object are stored, i.e., the list could be sorted on y-coordinates in the first dimension and X-coordinates in a second dimension.

The test for slivers 220 is there for two reasons. Firstly, it suppresses unnecessary processing for geometries that issue no particular problem downstream in the data processing. Secondly, it sorts out features/objects that have an extent in one particular direction. The later is required for a fracturing to work in an optimal way.

In said dynamic object said slivers are healed or merged together by removing internal boarder lines, which originally divide one sliver from another sliver. Only the outer boarder line of the dynamic object, defining its shape, is left unchanged. The healed object may have any shape of a polygon.

In one embodiment according to the present invention said healed data is refractured. Said refracturing is made because the data processing in the pattern generator only accepts pattern data comprising rectangles and trapezoids. In a case where said pattern generator accepts monotonous polygons, a refracturing may be required depending on the shape of the polygon. This step is unnecessary if the pattern generator is accepting any shape of polygons. The refracturing works by dividing a healed polygon at each vertex in the Y-direction. For polygons which originally have slivers in X-direction, the refracturing would cut the resulting polygon in y, in FIG. 1c sub features/objects 170, 171, 172, 173, 174, 175, 176, 177, 178, 179 and 180 are sub objects/features that are created after refracturing. The test for slivers in the healing algorithm provides control over the general extent of the polygon, information that is now applied in the refracturing. There are of course no fundamental limitations on to which axis the healing algorithm is applied. If the pattern data requires rotation for throughput reasons, the conditions could be rotated as well. The sliver test could even be extended to include both X- and Y-sliver detection, which would serve the benefit that all slivers could be healed, regardless of orientation and hence the algorithm would be neutral to rotation. The output from the sliver test would feed two separate channels, each representing a sliver orientation.

Given a pattern comprising slivers it is possible to accomplish healing by the inventive method that may decrease the summarized circumference for all rectangles in a pattern with a factor 0.3. For a raster pattern generator said decrease in circumference of features to be written will most likely decrease the writing time. For VSB pattern generators said decrease in circumference, and hence optimized X/Y ratio, will lead to a better CD control.

A processing time of the healing can be as low as the reading time of the pattern from the pattern data storage 210 into the pattern generator. The overhead of healing is low, meaning that if no slivers are detected, there is no, or very little, increase in processing time.

While the preceding examples are cast in terms of a method, devices and systems employing this method are easily understood. A magnetic memory containing a program capable of practicing the claimed method is one such device. A computer system having memory loaded with a program practicing the claimed method is another such device.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

I claim:

1. A method for reshaping sub-objects in at least one object in pattern design data to be presented to a mask writer or a direct writer for producing a pattern onto a workpiece, where said object comprises a plurality of slivers in a first direction, comprising the actions of:
   a) generating a list of slivers,
   repeating the actions of:
   b) comparing a dynamic object in an object list with the slivers in said list of slivers to look for adjacent slivers,
   c) removing adjacent slivers from said list of slivers to said object list,
   d) merging adjacent slivers with said dynamic object,
   e) terminating the repetition when no slivers in said list of slivers are adjacent to said dynamic object in said object list.

2. The method according to claim 1, further comprising the action of refracturing said dynamic object at least in a direction perpendicular to said first direction.

3. The method according to claim 1, wherein said dynamic object is compared both on its lower and upper long side with an upper and lower long side respectively of each sliver in said list of slivers.

4. The method according to claim 1, wherein said dynamic object originally is a sliver.

5. The method according to claim 1, wherein said sliver is defined by its aspect ratio, which is equal to or smaller than 1:3.

6. The method according to claim 2, wherein said refracturing divides said dynamic object into rectangles or trapezoids.

7. The method according to claim 1, wherein said workpiece is a semi conducting substrate.

8. The method according to claim 1, wherein said workpiece is a mask or reticle substrate.

9. The method according to claim 1, wherein said mask writer or maskless writer is based on a spatial light modulator (abbreviated "SLM") for generating the pattern on said workpiece.

10. The method according to claim 1, wherein said mask writer or maskless writer is a raster type mask writer or maskless writer.

11. The method according to claim 1, wherein said list of slivers comprising a smaller amount of slivers than the full amount of slivers in said pattern design data.

12. The method according to claim 1, wherein said reshaping of said sub-objects comprising the action of:
   minimizing a circumference of at least one object in said pattern design data.

13. The method according to claim 1, wherein said mask writer or maskless writer is of a vector shaped beam (abbreviated "VSB") type.

* * * * *